(12) United States Patent
Wada et al.

(10) Patent No.: US 10,964,563 B2
(45) Date of Patent: Mar. 30, 2021

(54) BONDING APPARATUS AND BONDING METHOD

(71) Applicant: Tokyo Electron Limited, Tokyo (JP)

(72) Inventors: Norio Wada, Kumamoto (JP);
Norifumi Kohama, Kumamoto (JP);
Kimio Motoda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 62 days.

(21) Appl. No.: 15/967,788

(22) Filed: May 1, 2018

(65) Prior Publication Data
US 2018/0323089 A1 Nov. 8, 2018

(30) Foreign Application Priority Data

May 2, 2017 (JP) .............................. JP2017-091544

(51) Int. Cl.
*H01L 21/67* (2006.01)
*H01L 21/683* (2006.01)

(52) U.S. Cl.
CPC .. *H01L 21/67098* (2013.01); *H01L 21/67092* (2013.01); *H01L 21/67103* (2013.01); *H01L 21/67248* (2013.01); *H01L 21/67259* (2013.01); *H01L 21/683* (2013.01); *H01L 21/6838* (2013.01)

(58) Field of Classification Search
CPC ......... H01L 21/67259; H01L 21/67098; H01L 21/683; H01L 21/67092; H01L 21/67103; H01L 21/67248; H01L 21/6838
USPC .................. 156/64, 359, 362, 378, 382, 498
See application file for complete search history.

(56) References Cited

U.S. PATENT DOCUMENTS

| | | | |
|---|---|---|---|
| 2014/0224763 A1* | 8/2014 | Okada | H01L 21/683 216/33 |
| 2014/0318711 A1* | 10/2014 | Wada | H01L 21/67092 156/378 |
| 2015/0129137 A1* | 5/2015 | Sugihara | H01L 21/67092 156/556 |
| 2016/0336203 A1* | 11/2016 | Lindner | H01L 21/67248 |

FOREIGN PATENT DOCUMENTS

JP 2016-039254 A 3/2016

* cited by examiner

*Primary Examiner* — George R Koch
(74) *Attorney, Agent, or Firm* — Pearne & Gordon LLP

(57) ABSTRACT

A local deformation which is generated on bonded substrates can be reduced. A bonding apparatus includes a first holding unit configured to attract and hold a first substrate from above; a second holding unit configured to attract and hold a second substrate from below; a striker configured to bring the first substrate into contact with the second substrate by pressing a central portion of the first substrate from above; a moving unit configured to move the second holding unit between a non-facing position where the second holding unit does not face the first holding unit and a facing position where the second holding unit faces the first holding unit; and a temperature control unit disposed to face the second holding unit placed at the non-facing position and configured to locally adjust a temperature of the second substrate attracted to and held by the second holding unit.

10 Claims, 14 Drawing Sheets

FIG. 10C
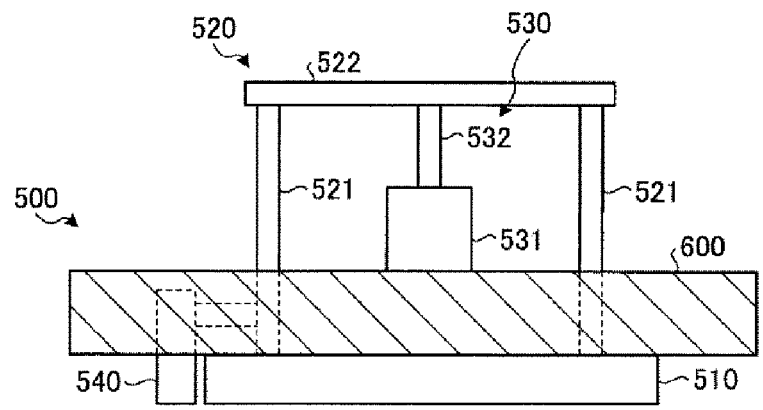
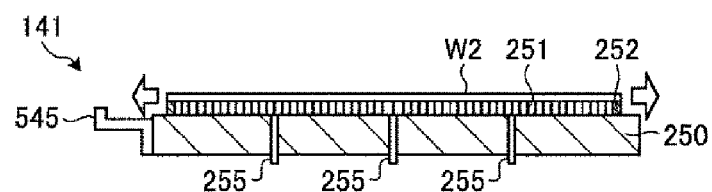
FIG. 10D
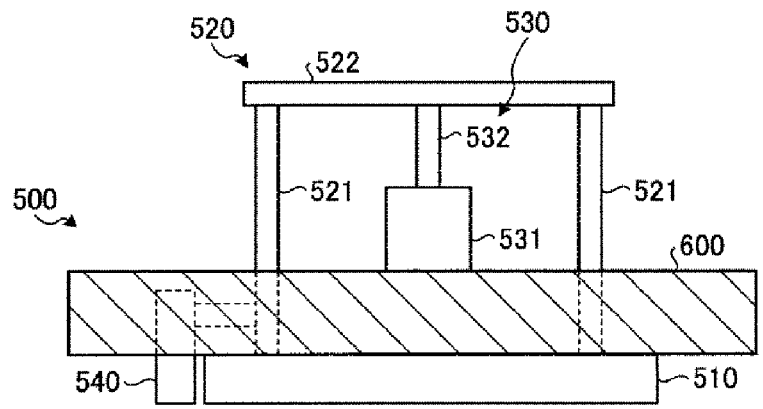
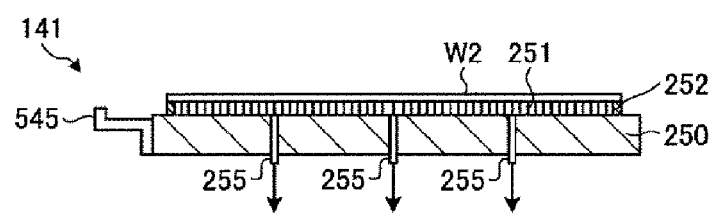

BONDING APPARATUS AND BONDING METHOD

CROSS-REFERENCE TO RELATED APPLICATION

This application claims the benefit of Japanese Patent Application No. 2017-091544 filed on May 2, 2017, the entire disclosures of which are incorporated herein by reference.

TECHNICAL FIELD

The embodiments described herein pertain generally to a bonding apparatus and a bonding method.

BACKGROUND

Conventionally, as a method of bonding substrates such as semiconductor wafers with each other, there is known a method of bonding two sheets of substrates semi-permanently by using an intermolecular force.

In this method, after the two sheets of substrates are placed to face each other in a vertical direction, a central portion of the substrate at the upper side (upper substrate) is pushed down and brought into contact with a central portion of the substrate at the lower side (lower substrate). Accordingly, the central portions of the upper and lower substrates are first bonded by the intermolecular force, so that a bonding region is formed. Then, as the bonding region is expanded toward peripheral portions of the substrates, the upper substrate and the lower substrate are bonded on the entire surfaces thereof.

Here, since the upper substrate is contacted to the lower substrate in a state that the upper substrate is bent, an unnecessary stress is applied to the upper substrate, and there is a concern that the bonded substrates might be deformed due to this stress.

To solve this problem, it has been suggested to maintain the lower substrate in a bent state as well by allowing a holding surface of a holding unit configured to hold the lower substrate to have a protruding shape (see Patent Document 1). According to this technique, by allowing the lower substrate to be bent as is the upper electrode, the deformation that might be caused to the bonded substrates can be reduced.

Patent Document 1: Japanese Patent Laid-open Publication No. 2016-039254

SUMMARY

However, even if such a countermeasure as stated in the prior art is taken, the bonded substrates may still suffer from a local deformation.

In view of the foregoing, exemplary embodiments provide a bonding apparatus and a bonding method capable of suppressing the local deformation which is generated on the bonded substrates.

In an exemplary embodiment, a bonding apparatus includes a first holding unit, a second holding unit, a striker, a moving unit and a temperature control unit. The first holding unit is configured to attract and hold a first substrate from above. The second holding unit is configured to attract and hold a second substrate from below. The striker is configured to bring the first substrate into contact with the second substrate by pressing a central portion of the first substrate from above. The moving unit is configured to move the second holding unit between a non-facing position where the second holding unit does not face the first holding unit and a facing position where the second holding unit faces the first holding unit. The temperature control unit is disposed to face the second holding unit placed at the non-facing position and is configured to locally adjust a temperature of the second substrate attracted to and held by the second holding unit.

According to the exemplary embodiment, the local deformation which is generated on the bonded substrates can be reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 10C is a diagram for describing an operation of the temperature control and deformation correction processing;

FIG. 10D is a diagram for describing an operation of the temperature control and deformation correction processing;

DETAILED DESCRIPTION

Figure 1:
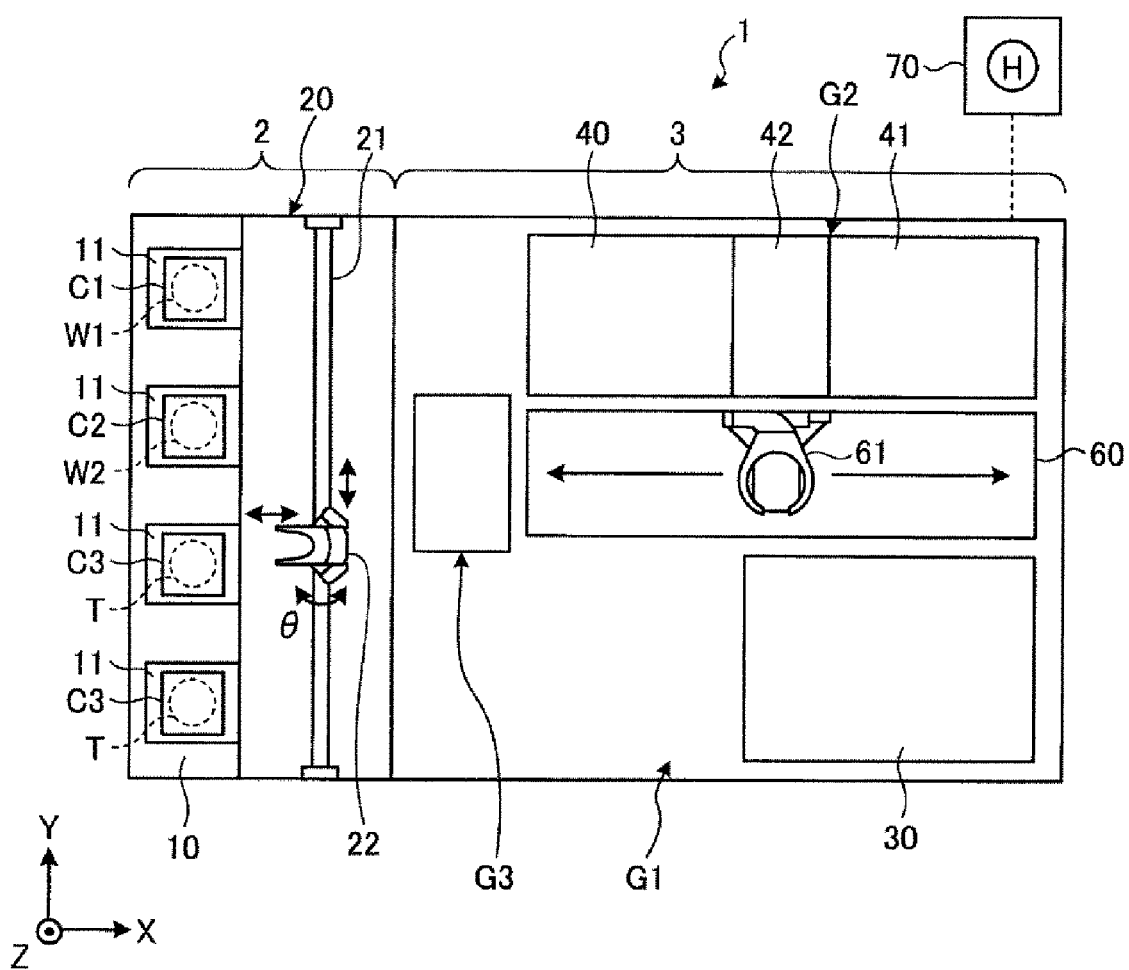
FIG. 1 is a schematic plan view illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a bonding apparatus and a bonding method according to the present disclosure will be explained in detail with reference to the accompanying drawings. It should be noted that the exemplary embodiments are not intended to be anyway limiting.

<1. Configuration of Bonding System>

Figure 2:
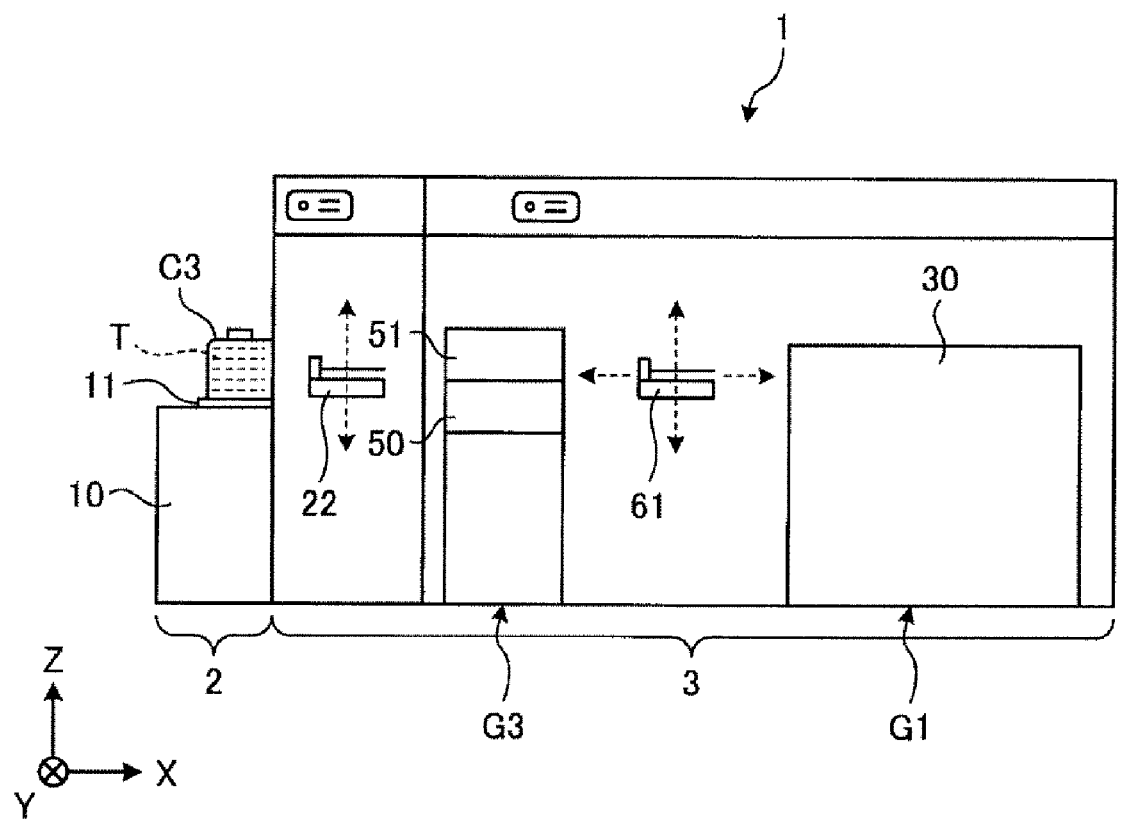
FIG. 2 is a schematic side view illustrating the configuration of the bonding system according to the exemplary embodiment.
Figure 3:
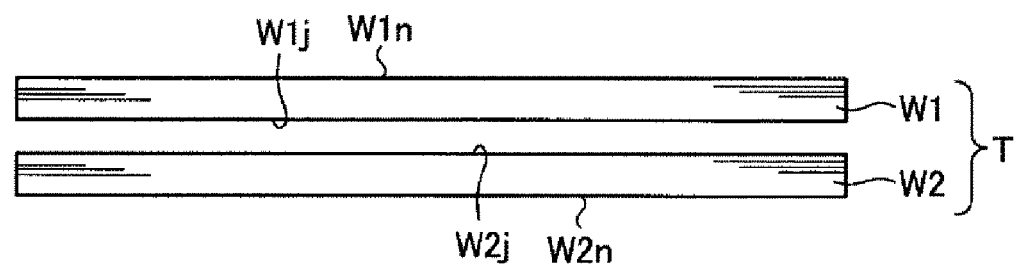
FIG. 3 is a schematic side view of a first substrate and a second substrate.

First, a configuration of a bonding system according to an exemplary embodiment will be explained with reference to FIG. 1 and FIG. 2. FIG. 1 is a schematic plan view illustrating a configuration of the bonding system according to the exemplary embodiment, and FIG. 2 is a schematic side view illustrating the configuration of the bonding system according to the exemplary embodiment. Further, FIG. 3 illustrates a schematic side view of a first substrate and a second substrate. In order to clarify positional relationships, the X-axis direction, Y-axis direction and Z-axis direction which are orthogonal to each other are defined, and the positive Z-axis direction will be regarded as a vertically upward direction. Furthermore, in the respective drawings including FIG. 1 to FIG. 3, only the component parts relevant to the explanation are illustrated, and illustration of general component parts may be omitted.

A bonding system 1 according to the exemplary embodiment shown in FIG. 1 is configured to form a combined substrate T by joining a first substrate W1 and a second substrate W2 to each other (see FIG. 3).

The first substrate W1 is, for example, a semiconductor substrate such as a silicon wafer or a compound semiconductor wafer on which a multiple number of electronic circuits are formed. The second substrate W2 is, for example, a bare wafer on which no electronic circuit is formed. The first substrate W1 and the second substrate W2 have the substantially same diameter.

Further, an electronic circuit may be formed on the second substrate W2 as well as on the first substrate W1. As an example of the aforementioned compound semiconductor wafer, a wafer containing gallium arsenide, silicon carbide, gallium nitride or indium phosphide may be used, but not limited thereto.

In the description that follows, the first substrate W1 may sometimes be referred to as "upper wafer W1"; the second substrate W2, "lower wafer W2"; and the combined substrate T, "combined wafer T".

Further, in the following description, as depicted in FIG. 3, among surfaces of the upper wafer W1, a surface to be bonded to the lower wafer W2 will be referred to as "bonding surface W1$j$", and a surface opposite to the bonding surface W1$j$ will be referred to as "non-bonding surface W1$n$". Further, among surfaces of the lower wafer W2, a surface to be bonded to the upper wafer W1 will be referred to as "bonding surface W2$j$", and a surface opposite to the bonding surface W2$j$ will be referred to as "non-bonding surface W2$n$".

As shown in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2 and C3 each of which accommodates therein a plurality of (e.g., 25 sheets of) substrates horizontally. For example, the cassette C1 accommodates therein the upper wafers W1; the cassette C2, the lower wafers W2; and the cassettes C3, the combined wafers T.

The transfer section 20 is provided adjacent to the positive X-axis side of the placing table 10. Provided in the transfer section 20 are a transfer path 21 extended in the Y-axis direction and a transfer device 22 configured to be movable along the transfer path 21. The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition, besides the cassettes C1 to C3, a cassette or the like for collecting a problematic substrate may be additionally provided on the placing plates 11.

A multiple number of, for example, three processing blocks G1, G2 and G3 equipped with various kinds of devices are provided in the processing station 3. For example, the first processing block G1 is provided at a front side (negative Y-axis side of FIG. 1) of the processing station 3, and the second processing block G2 is provided at a rear side (positive Y-axis side of FIG. 1) of the processing station 3. Further, the third processing block G3 is provided at a side of the carry-in/out station 2 (negative X-axis side of FIG. 1) of the processing station 3.

Provided in the first processing block G1 is a surface modifying apparatus 30 configured to modify the bonding surface W1$j$ of the upper wafer W1 and the bonding surface W2$j$ of the lower wafer W2. In the surface modifying apparatus 30, the $SiO_2$ bond on the bonding surfaces W1$j$ and W2$j$ of the upper wafer W1 and the lower wafer W2 is cut to be turned into SiO of a single bond, so that the bonding surfaces W1$j$ and W2$j$ are modified such that these surfaces are easily hydrophilized afterwards.

Furthermore, in the surface modifying apparatus 30, for example, an oxygen gas or a nitrogen gas as a processing gas is excited into plasma under a decompressed atmosphere to be ionized. As these oxygen ions or nitrogen ions are irradiated to the bonding surfaces W1j and W2j of the upper wafer W1 and the lower wafer W2, the bonding surfaces W1j and W2j are plasma-processed to be modified.

In the second processing block G2, a surface hydrophilizing apparatus 40, a bonding apparatus 41 and a substrate temperature controlling apparatus 42 are disposed. The surface hydrophilizing apparatus 40 is configured to hydrophilize the bonding surfaces W1j and W2j of the upper wafer W1 and the lower wafer W2 with, for example, pure water. In this surface hydrophilizing apparatus 40, while rotating the upper wafer W1 (the lower wafer W2) held by, for example, a spin chuck, the pure water is supplied onto the upper wafer W1 (the lower wafer W2). Accordingly, the pure water supplied onto the upper wafer W1 (the lower wafer W2) is diffused onto the bonding surface W1j of the upper wafer W1 (the bonding surface W2j of the lower wafer W2), so that the bonding surfaces W1j and W2j are hydrophilized.

The bonding apparatus 41 is configured to bond the upper wafer W1 and the lower wafer W2, which are hydrophilized, by an intermolecular force. A configuration of the bonding apparatus 41 will be discussed later.

The substrate temperature controlling apparatus 42 is configured to adjust a temperature of the upper wafer W1 before the bonding. By way of example, the substrate temperature controlling apparatus 42 is equipped with a placing unit configured to place the upper wafer W1 thereon and a temperature control device configured to control the temperature of the upper wafer W1 placed on the placing unit. A coolant such as cooling water having a controlled temperature is flown in the temperature control device, and by adjusting the temperature of the cooling water, the temperature of the upper wafer W1 can be controlled.

Further, a temperature control of the lower wafer W2 is performed not by the aforementioned substrate temperature controlling apparatus 42 but by a temperature control unit provided in the bonding apparatus 41. In this temperature control unit, a processing of controlling a temperature of the lower wafer W2 is performed at the same time as a processing of correcting a local deformation of the lower wafer W2, as will be described later.

In the third processing block G3, as shown in FIG. 2, transition (TRS) devices 50 and 51 for the upper wafer W1, the lower wafer W2 and the combined wafer T are provided in two levels in this order from below. Further, the number of the transition devices 50 and 51 is not limited to two.

Further, as illustrated in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis. The transfer device 61 is moved within the transfer section 60 and transfers the upper wafers W1, the lower wafers W2 and the combined wafers T with respect to preset devices within the first processing block G1, the second processing block G2 and the third processing block G3 which are adjacent to the transfer section 60.

Furthermore, as depicted in FIG. 1, the bonding system 1 includes a control device 70. The control device 70 controls an operation of the bonding system 1. The control device 70 may be implemented by, for example, a computer and includes a non-illustrated controller and a non-illustrated storage unit. The controller includes a microcomputer having a CPU (Central Processing Unit), a ROM (Read Only Memory), a RAM (Random Access Memory), an input/output port, or the like, or various kinds of circuits. The CPU of the microcomputer implements a control operation to be described later by reading and executing a program stored in the ROM. The storage unit may be implemented by, but not limited to, a semiconductor memory device such as a RAM or a flash memory, or a storage device such as a hard disc, an optical disc, or the like.

Further, the program may be recorded in a computer-readable recording medium and installed from the recording medium to the storage unit of the control device 70. The computer-readable recording medium may be, by way of non-limiting example, a hard disc (HD), a flexible disc (FD), a compact disc (CD), a magnet optical disc (MO), or a memory card.

<2. Configuration of Bonding Apparatus>

Figure 4:
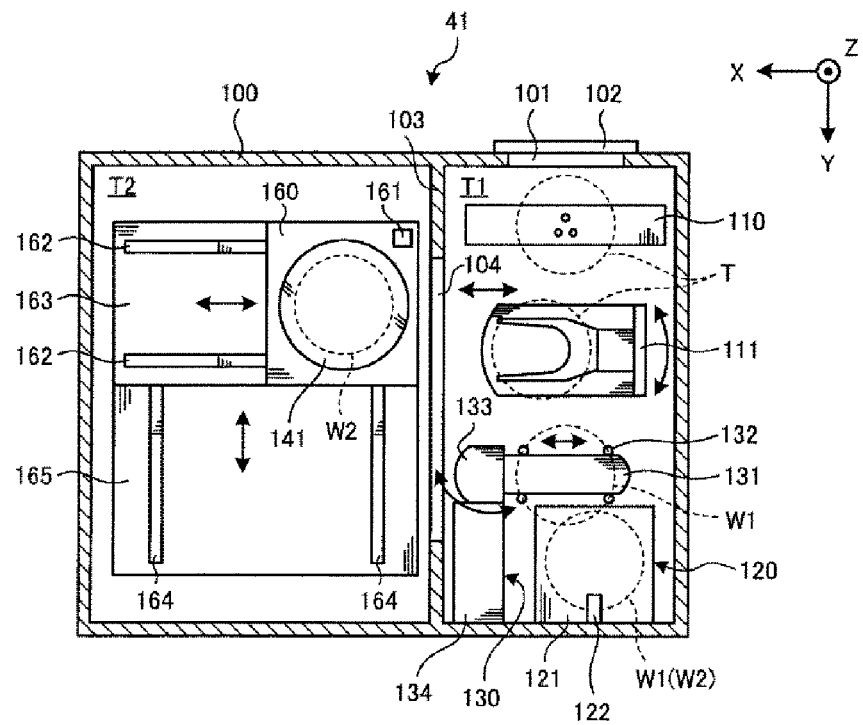
FIG. 4 is a schematic plan view illustrating a configuration of a bonding apparatus.
Figure 5:
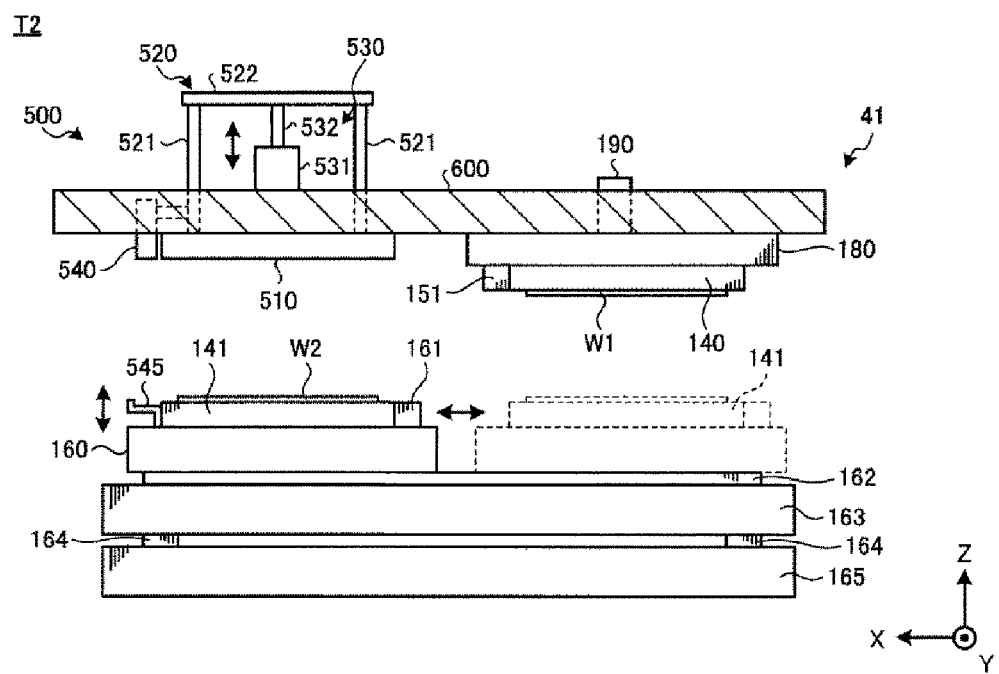
FIG. 5 is a schematic side view illustrating the configuration of the bonding apparatus.

Now, a configuration of the bonding apparatus 41 will be explained with reference to FIG. 4 and FIG. 5. FIG. 4 is a schematic plan view illustrating a configuration of the bonding apparatus 41. FIG. 5 is a schematic side view illustrating the configuration of the bonding apparatus 41.

As depicted in FIG. 4, the bonding apparatus 41 includes a processing vessel 100 having a hermetically sealable inside. A carry-in/out opening 101 for the upper wafer W1, the lower wafer W2 and the combined wafer T is formed on a lateral side of the processing vessel 100 at a side of the transfer region 60. A shutter 102 for opening/closing the carry-in/out opening 101 is provided at the carry-in/out opening 101.

The inside of the processing vessel 100 is partitioned into a transfer region T1 and a processing region T2 by an inner wall 103. The aforementioned carry-in/out opening 101 is formed on the lateral side of the processing vessel 100 in the transfer region T1. Further, the inner wall 103 is also provided with a carry-in/out opening 104 for the upper wafer W1, the lower wafer W2 and the combined wafer T.

A transition 110, a wafer transfer mechanism 111, an inverting mechanism 130 and a position adjusting mechanism 120 are arranged in the transfer region T1 in this order from the carry-in/out opening 101, for example.

The transition 110 is configured to temporarily place thereon the upper wafer W1, the lower wafer W2 and the combined wafer T. The transition 110 has two levels, for example, and is capable of holding any two of the upper wafer W1, the lower wafer W2 and the combined wafer T.

The wafer transfer mechanism 111 is equipped with a transfer arm configured to be movable in the vertical direction (Z-axis direction) and the horizontal directions (Y-axis direction and X-axis direction) and also pivotable around a vertical axis, as shown in FIG. 4. The wafer transfer mechanism 111 is capable of transferring the upper wafer W1, the lower wafer W2 and the combined wafer T within the transfer region T1 or between the transfer region T1 and the processing region T2.

The position adjusting mechanism 120 is configured to adjust a direction of the upper wafer T1 (lower wafer W2) in the horizontal direction. To elaborate, the position adjusting mechanism 120 includes a base 121 equipped with a non-illustrated holding unit configured to hold and rotate the upper wafer W1 (lower wafer W2); and a detector 122 configured to detect a position of a notch of the upper wafer W1 (lower wafer W2). The position adjusting mechanism 120 adjusts the position of the notch of the upper wafer W1 (lower wafer W2) by detecting the position of the notch with the detector 122 while rotating the upper wafer W1 (lower wafer W2) held by the base 121. Accordingly, the position of the upper wafer W1 (lower wafer W2) in the horizontal direction is adjusted.

The inverting mechanism 130 is configured to invert a front surface and a rear surface of the upper wafer W1. To elaborate, the inverting mechanism 130 is equipped with a holding arm 131 configured to hold the upper wafer W1. The holding arm 131 is extended in the horizontal direction (X-axis direction). Further, the holding arm 131 is provided with, for example, holding members 132 configured to hold the upper wafer W1 at four positions.

The holding arm 131 is supported by a driving unit 133 including, for example, a motor or the like. The holding arm 131 is configured to be rotatable around the horizontal axis by the driving unit 133. Further, the holding arm 131 is rotatable around the driving unit 133 and movable in the horizontal direction (X-axis direction). Another driving unit (not shown) including, for example, a motor or the like is provided under the driving unit 133. The driving unit 133 can be moved in the vertical direction along a vertically extended supporting column 134 by this another driving unit.

Further, the upper wafer W1 held by the holding members 132 can be rotated around the horizontal axis through the driving unit 133 and can also be moved in the vertical direction and the horizontal direction. Further, the upper wafer W1 held by the holding members 132 can be moved between the position adjusting mechanism 120 and an upper chuck 140 to be described later by being rotated around the driving unit 133.

As depicted in FIG. 5, the upper chuck 140, the lower chuck 141 and a temperature control unit 500 are provided in the processing region T2.

The upper chuck 140 and the temperature control unit 500 are fixed to a common horizontal frame 600, and the lower chuck 141 is located below the upper chuck 140 and the temperature control unit 500.

The upper chuck 140 is configured to attract and hold the top surface (non-bonding surface W1n) of the upper wafer W1 from above. The upper chuck 140 is fixed to the horizontal frame 600 with a supporting member 180 therebetween. The supporting member 180 is provided above the upper chuck 140.

The supporting member 180 is equipped with an upper imaging unit 151 configured to image the top surface (bonding surface W2j) of the lower wafer W2 held by the lower chuck 141. The upper imaging unit 151 is implemented by, by way of example, but not limitation, a CCD (Charge Coupled Device) camera.

The lower chuck 141 is configured to mount the lower wafer W2 thereon and also configured to attract and hold the bottom surface (non-bonding surface W2n) of the lower wafer W2 from below.

The lower chuck 141 is supported by a first lower chuck moving unit 160 which is provided under the corresponding lower chuck 141. The first lower chuck moving unit 160 is configured to move the lower chuck 141 in the horizontal direction (X-axis direction), as will be described later. Further, the first lower chuck moving unit 160 is also configured to move the lower chuck 141 in the vertical direction and rotate the lower chuck 141 around the vertical axis. The first lower chuck moving unit 160 is an example of a second elevating unit configured to move the lower chuck 141 up and down.

The first lower chuck moving unit 160 is equipped with a lower imaging unit 161 configured to image the bottom surface (bonding surface W1j) of the upper wafer W1 held by the upper chuck 140 (See FIG. 5). The lower imaging unit 161 is implemented by, by way of example, a CCD camera.

The first lower chuck moving unit 160 is mounted to a pair of rails 162 which is provided at a bottom surface side of the first lower chuck moving unit 160 and extended in the horizontal direction (X-axis direction). The first lower chuck moving unit 160 is configured to be moved along the rails 162.

The pair of rails 162 is provided on a second lower chuck moving unit 163. The second lower chuck moving unit 163 is mounted on a pair of rails 164 which is provided at a bottom surface side of the second lower chuck moving unit 163 and extended in the horizontal direction (Y-axis direction). This second lower chuck moving unit 163 is configured to be moved in the horizontal direction (Y-axis direction) along the rails 164. Further, the pair of rails 164 is provided on a placing table 165 provided on the bottom surface of the processing vessel 100.

The bonding apparatus 41 is capable of moving the lower chuck 141 between a facing position where the lower chuck 141 faces the upper chuck 140 and a non-facing position where the lower chuck 141 does not face the upper chuck 140 by the first lower chuck moving unit 160 and the second lower chuck moving unit 163.

The temperature control unit 500 is provided at a position facing the lower chuck 141 placed at the non-facing position. Further, a position of the lower chuck 141 shown by a solid line in FIG. 5 is the "non-facing position", and a position of the lower chuck 141 marked by a dashed line is the "facing position".

The temperature control unit 500 is configured to locally adjust the temperature of the lower wafer W2 attracted to and held by the lower chuck 141. To elaborate, the temperature control unit 500 includes a main unit 510 having a bottom surface of a diameter larger than that of the lower wafer W2; a supporting unit 520 configured to support the main unit 510 from above; and an elevating unit 530 configured to move the supporting unit 520 in the vertical direction. Further, the temperature control unit 500 is also equipped with a measurement unit 540 configured to measure a distance from a reference position to a measurement position set at the lower chuck 141.

The supporting unit 520 is equipped with multiple supporting column members 521 connected to the main unit 510; and a ceiling plate 522 provided above the supporting column members 521. The elevating unit 530 is equipped with a driving source 531 such as a cylinder; and a rod 532 configured to be move up and down by the driving source 531. The rod 532 is connected to a bottom surface of the ceiling plate 522. If the rod 532 is moved up and down by the driving source 531, the ceiling plate 522 connected to the rod 532 is also moved up and down, and the multiple supporting column members 521 coupled to the ceiling plate 522 are also moved up and down. Accordingly, the main unit 510 supported by the multiple supporting column members 521 can be moved up and down. The elevating unit 530 is an example of a first elevating unit configured to move the main unit 510 up and down.

The measurement unit 540 is mounted to, for example, one of the multiple supporting column members 521 and is moved up and down along with the main unit 510. A measurement member 545 having a horizontal surface at an upper portion thereof is provided at a lateral surface of the lower chuck 141. The measurement member 545 is set to be positioned under the measurement unit 540 when the lower chuck 141 placed at the non-facing position.

This measurement unit 540 is configured to measure the vertical distance from the reference position to the measurement position and configured to output a measurement result to the control device 70. By way of non-limiting example, a lower end of the measurement unit 540 is set as the reference position, and a top surface of the measurement member 545 is set as the measurement position.

Figure 6A:
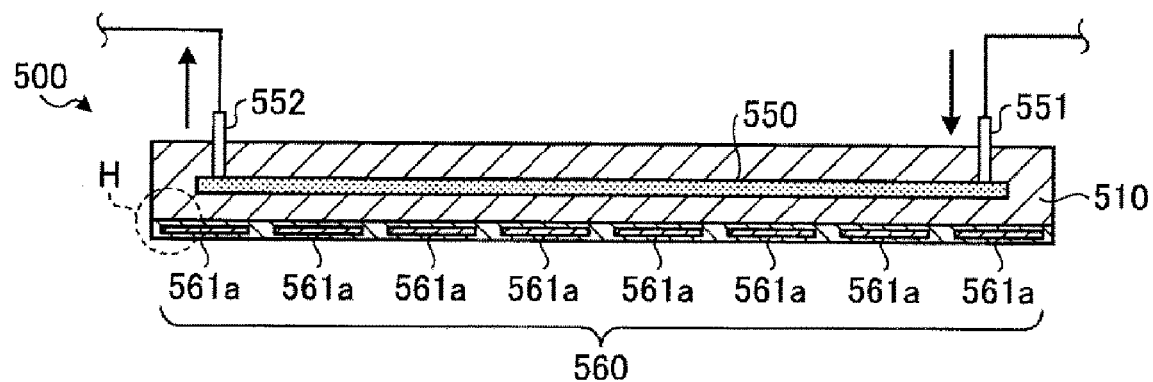
FIG. 6A is a schematic side sectional view of a main unit.
Figure 6B:
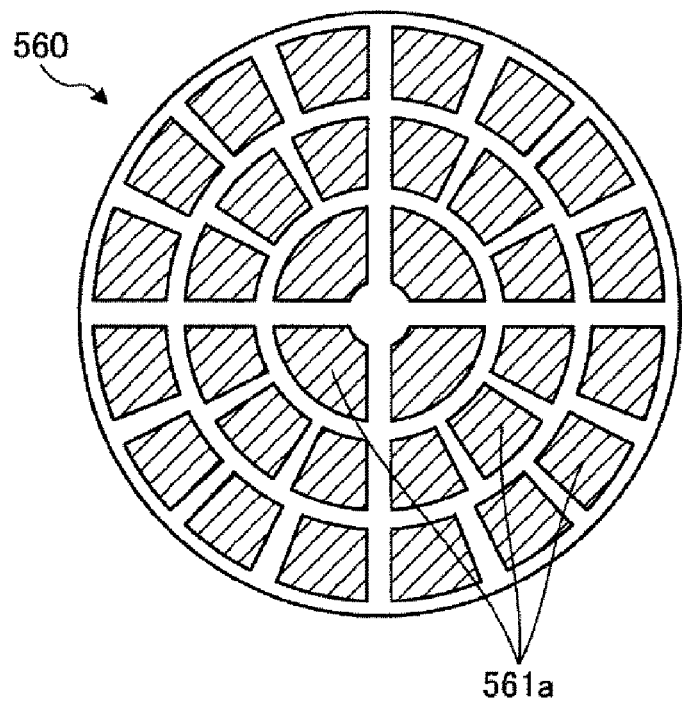
FIG. 6B is a schematic bottom view of a heating unit.
Figure 6C:
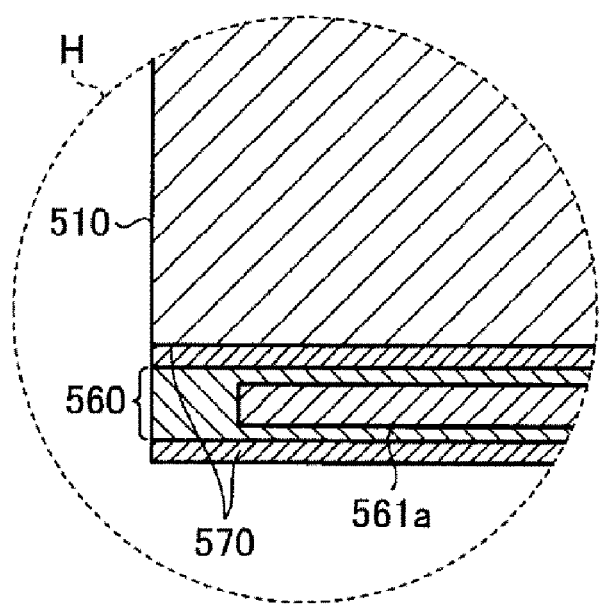
FIG. 6C is a schematic enlarged view of a portion "H" shown in FIG. 6A.

Now, the configuration of the temperature control unit 500 will be further elaborated with reference to FIG. 6A to FIG. 6C. FIG. 6A is a schematic side sectional view of the main unit 510; FIG. 6B, a schematic bottom view of a heating unit; and FIG. 6C, a schematic enlarged view of a portion H in FIG. 6A.

As depicted in FIG. 6A, the temperature control unit 500 includes a cooling unit 550 and a heating unit 560. By way of example, the cooling unit 550 is a flow path formed within the main unit 510 and is connected to an inlet line 551 through which a coolant such as cooling water is introduced into the cooling unit 550 and is connected to an outlet line 552 through which the coolant is flown out from the cooling unit 550. This cooling unit 550 is configured to cool the entire region of the lower wafer W2 uniformly by allowing the coolant having a controlled temperature to flow therein.

Meanwhile, the heating unit 560 is configured to heat the lower wafer W2 locally. To be specific, the heating unit 560 has a plurality of independent heating regions 561*a*. By allowing these heating regions 561*a* to generate heat selectively, a part of or the entire region of the lower wafer W2 can be heated.

Here, as depicted in FIG. 6B, the heating regions 561*a* are concentrically arranged in a circumferential direction in multiple levels. However, the arrangement of the heating regions 561*a* may not be limited thereto. By way of example, the heating regions 561*a* may be arranged in a grid pattern.

The heating unit 560 is placed to be closer to the lower wafer W2 than the cooling unit 550 is. To elaborate, the cooling unit 550 is provided within the main unit 510, whereas the heating unit 560 is provided at the bottom surface of the main unit 510, that is, the facing surface to the lower wafer W2. With this configuration, the heating unit 560 can be brought close to the lower wafer W2, so that the lower wafer W2 can be heated more efficiently. Further, as shown in FIG. 6C, the heating unit 560 is implemented by a surface-shaped heating element such as a polyimide surface-shaped heater and is fastened to the main unit 510 with aluminum sheets 570 provided on and under the heating unit 560.

As stated above, by arranging the heating unit 560 to be placed closer to the lower wafer W2 than the cooling unit 550 is, the lower wafer W2 can be efficiently heated.

Figure 7:
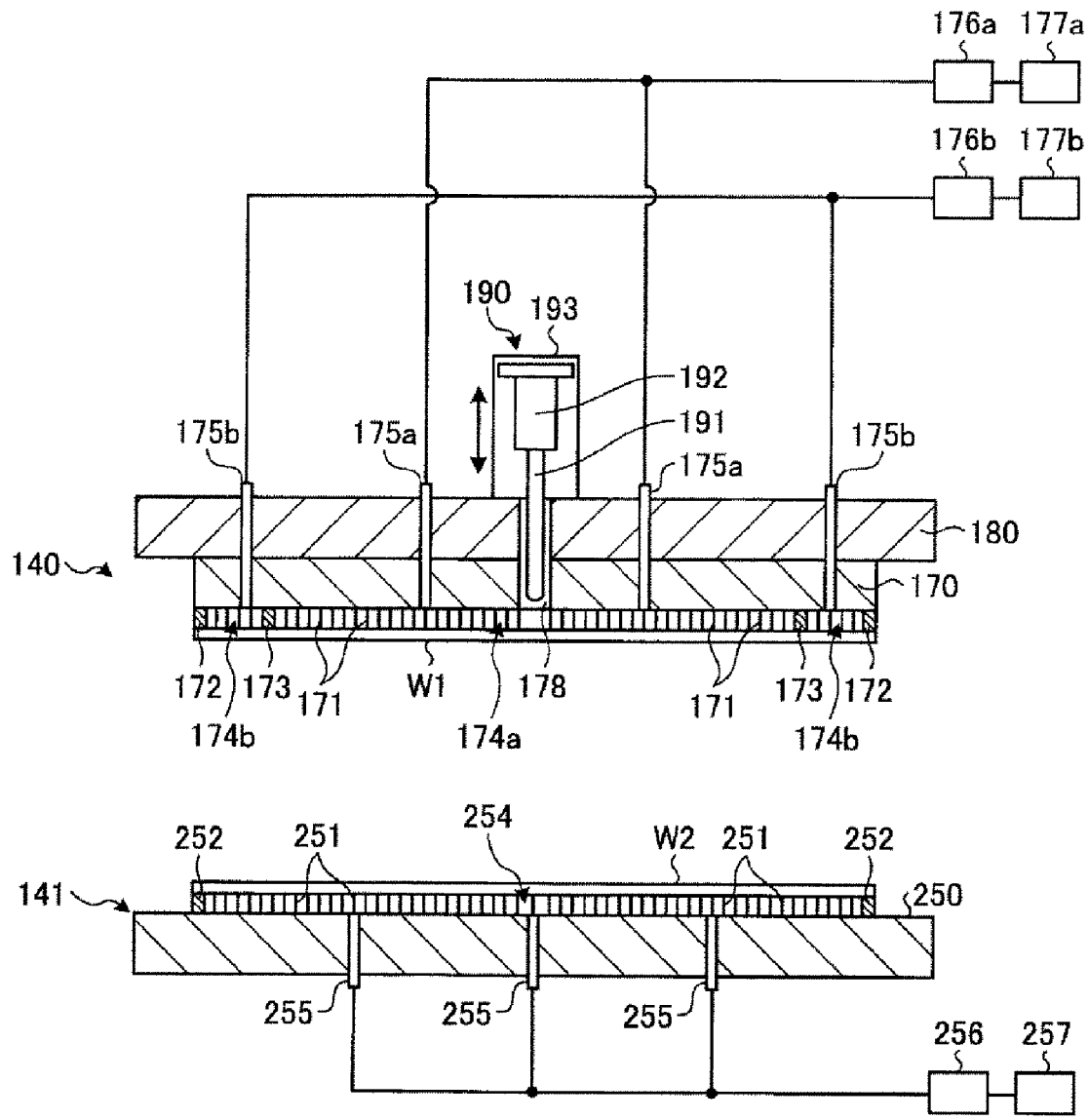
FIG. 7 is a schematic side sectional view illustrating configurations of an upper chuck and a lower chuck.

Now, the configuration of the upper chuck 140 and the lower chuck 141 of the bonding apparatus 41 will be explained with reference to FIG. 7. FIG. 7 is a schematic side sectional view illustrating the configuration of the upper chuck 140 and the lower chuck 141.

As depicted in FIG. 7, the upper chuck 140 has a main body 170 having a diameter equal to or larger than that of the upper wafer W1.

The main body 170 is supported by a supporting member 180. The supporting member 180 is configured to cover at least a top surface of the main body 170 when viewed from the top and is fixed to the main body 170 by, for example, screwing.

A through hole 178 is formed through central portions of the supporting member 180 and the main body 170 in the vertical direction. A position of the through hole 178 corresponds to the central portion of the upper wafer W1 attracted to and held by the upper chuck 140. A push pin 191 of a striker 190 is inserted through the through hole 178.

The striker 190 is provided on a top surface of the supporting member 180 and is equipped with the push pin 191, an actuator unit 192 and a linearly moving mechanism 193. The push pin 191 is a cylindrical member extended along the vertical direction and is supported by the actuator unit 192.

The actuator unit 192 is configured to generate a constant pressure in a certain direction (here, vertically downward direction) by air supplied from, for example, an electro-pneumatic regulator (not shown). By the air supplied from the electro-pneumatic regulator, the actuator unit 192 is capable of controlling a press load applied to the central portion of the upper wafer W1 as it is brought into contact with the central portion of the upper wafer W1. Further, a leading end of the push pin 191 is movable up and down in the vertical direction through the through hole 178 by the air from the electro-pneumatic regulator.

The actuator unit 192 is supported at the linearly moving mechanism 193. The linearly moving mechanism 193 moves the actuator unit 192 in the vertical direction by a driving unit including a motor, for example.

The striker 190 is configured as described above, and controls a movement of the actuator unit 192 by the linearly moving mechanism 193 and controls the press load upon the upper wafer W1 from the push pin 191 by the actuator unit 192.

A plurality of pins 171 is provided on a bottom surface of the main body 170, and these pins 171 are in contact with the rear surface (non-bonding surface W1*n*) of the upper wafer W1. Further, also provided on the bottom surface of the main body 170 is a rib 172 configured to support a peripheral portion of the rear surface (non-bonding surface W1*n*) of the upper wafer W1. The rib 172 is provided in a ring shape at the outside of the plurality pins 171.

Further, an additional rib 173 is also provided on the bottom surface of the main body 170, and this rib 173 is located at an inner position than the rib 172. The rib 173 is provided in a ring shape to be concentric with the rib 172. A region inside the rib 172 is divided into a first suction region 174*a* inside the rib 173; and a second suction region 174*b* outside the rib 173.

A plurality of suction line 175*a* is provided in the first suction region 174*a*. These suction lines 175*a* are connected to a vacuum pump 177*a* via a pressure controller 176*a*. Further, a multiplicity of suction lines 175*b* is provided in the second suction region 174*b*. These suction lines 175*b* are connected to a vacuum pump 177*b* via a pressure controller 176*b*.

The suction regions 174*a* and 174*b* formed by being surrounded by the upper wafer W1, the main body 170 and the rib 172 are vacuum-evacuated through the suction lines 175*a* and 175*b*, respectively, so that the suction regions 174*a* and 174*b* are decompressed. At this time, since an atmosphere outside the suction regions 174*a* and 174*b* is of an atmospheric pressure, the upper wafer W1 is pushed toward the suction regions 174*a* and 174*b* by the atmospheric pressure as much as a decompressed amount and attracted to and held by the upper chuck 140. The upper chuck 140 is capable of vacuum-evacuating the first suction region 174*a* and the second suction region 174*b* individually to attract the upper wafer W1.

In this configuration, since the rib 172 supports the peripheral portion of the rear surface (non-bonding surface W1*n*) of the upper wafer W1, the vacuum-evacuation is applied up to the peripheral portion of the upper wafer W1. Accordingly, the entire surface of the upper wafer W1 is attracted to and held by the upper chuck 140, and flatness of the corresponding upper wafer W1 is reduced, and, thus, the upper wafer W1 can be flattened.

Besides, since the heights of the pins 171 are uniform, flatness of the bottom surface of the upper chuck 140 can be further reduced. In this way, by flattening the bottom surface of the upper chuck 140 (that is, by reducing the flatness of the bottom surface thereof), a vertical deformation of the upper wafer W1 held by the upper chuck 140 can be suppressed. Further, since the rear surface (non-bonding surface W1n) of the upper wafer W1 is supported by the pins 171, the upper wafer W1 can be easily separated from the upper chuck 140 when releasing the vacuum-evacuation of the upper wafer W1 by the upper chuck 140.

Now, the configuration of the lower chuck 141 will be explained. The lower chuck 141 is of a pin chuck type, the same as the upper chuck 140. The lower chuck 141 has a main body 250 having a diameter which is the same as or larger than that of the lower wafer W2. A plurality of pins 251 is provided on a top surface of the main body 250, and these pins 251 are in contact with the rear surface (non-bonding surface W2n) of the lower wafer W2. Further, a rib 252 configured to support a peripheral portion of the rear surface (non-bonding surface W2n) of the lower wafer W2 is provided on the top surface of the main body 250. The rib 252 is provided in a ring shape at the outside of the plurality of pins 251.

In the main body 250, a plurality of suction lines 255 is provided in an inner region than the rib 252. These suction lines 255 are connected to a vacuum pump 257 via a pressure controller 256.

A suction region 254 formed by being surrounded by the lower wafer W2, the main body 250 and the rib 252 is vacuum-evacuated through the suction lines 255, so that the suction region 254 is decompressed. At this time, since an atmosphere outside the suction region 254 is of an atmospheric pressure, the lower wafer W2 is pushed toward the suction region 254 by the atmospheric pressure as much as a decompressed amount and attracted to and held by the lower chuck 141 horizontally.

In this configuration, since the rib 252 supports the peripheral portion of the rear surface of the lower wafer W2, the vacuum-evacuation is applied up to the peripheral portion of the lower wafer W2. Accordingly, the entire surface of the lower wafer W2 is attracted to and held by the lower chuck 141, and flatness of the corresponding lower wafer W2 is reduced and, thus, the lower wafer W2 can be flattened. Furthermore, since the rear surface of the lower wafer W2 is supported by the pins 251, the lower wafer W2 can be easily separated from the lower chuck 141 when releasing the vacuum-evacuation of the lower wafer W2 by the lower chuck 141.

<3. Specific Operation of Bonding System>

Figure 8:
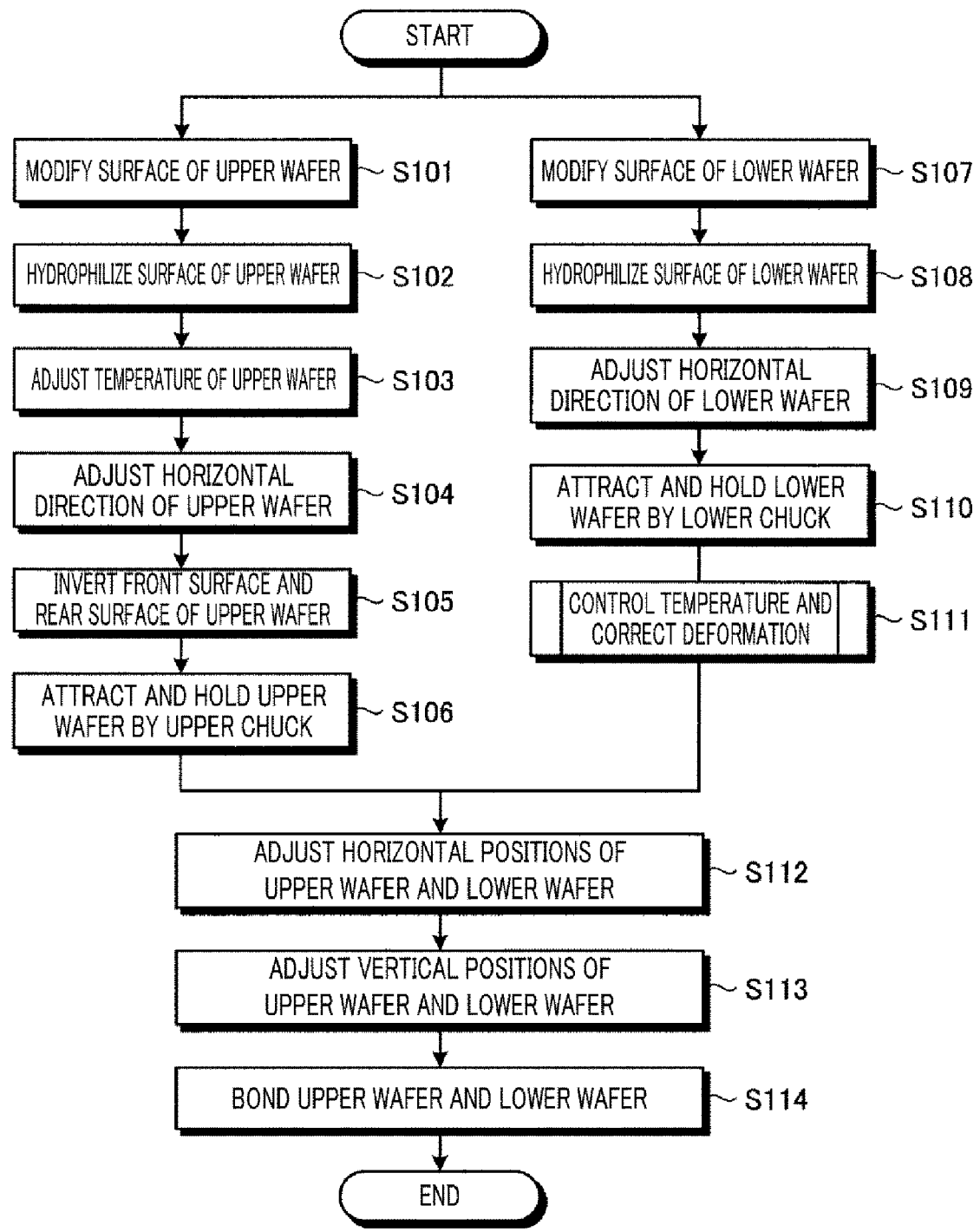
FIG. 8 is a flowchart illustrating a part of a processing performed by the bonding system.
Figure 9:
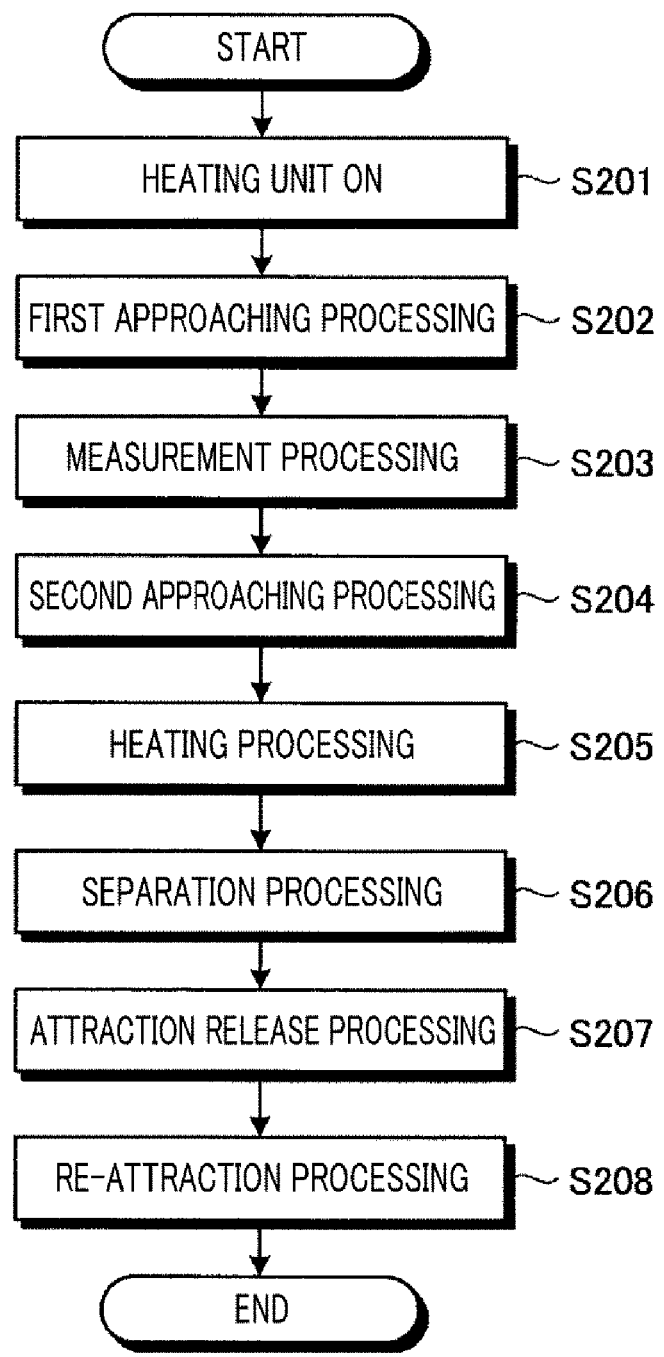
FIG. 9 is a flowchart illustrating a sequence of a temperature control and deformation correction processing.

Now, a specific operation of the bonding system 1 will be explained with reference to FIG. 8 to FIG. 11G. FIG. 8 is a flowchart for describing a part of a processing performed by the bonding system 1. FIG. 9 is a flowchart for describing a sequence of a temperature control and deformation correction processing. Further, FIG. 10A to FIG. 10D are diagrams for describing operations of the temperature control and deformation correction processing. FIG. 11A to FIG. 11G are diagrams for describing operations of the bonding processing. Further, various processings shown in FIG. 8 and FIG. 9 are performed under the control of the control device 70.

First, a cassette C1 accommodating a plurality of upper wafers W1, a cassette C2 accommodating a plurality of lower wafers W2 and an empty cassette C3 are placed on the preset placing plates 11 of the carry-in/out station 2. Then, an upper wafer W1 is taken out of the cassette C1 by the transfer device 22 and is transferred to the transition device 50 of the third processing block G3 of the processing station 3.

Subsequently, the upper wafer W1 is transferred into the surface modifying apparatus 30 of the first processing block G1 by the transfer device 61. In the surface modifying apparatus 30, an oxygen gas as the processing gas is excited into plasma and ionized under the preset decompressed atmosphere. The oxygen ions are irradiated to the bonding surface W1j of the upper wafer W1, and the bonding surface W1j is plasma-processed. As a result, the bonding surface W1j of the upper wafer W1 is modified (process S101).

Then, the upper wafer W1 is transferred into the surface hydrophilizing apparatus 40 of the second processing block G2 by the transfer device 61. In the surface hydrophilizing apparatus 40, the pure water is supplied onto the upper wafer W1 while rotating the upper wafer W1 held by the spin chuck. The supplied pure water is diffused on the bonding surface W1j of the upper wafer W1, and hydroxyl groups (silanol groups) adhere to the bonding surface W1j of the upper wafer W1 modified in the surface modifying apparatus 30, so that the bonding surface W1j is hydrophilized. Further, the bonding surface W1j of the upper wafer W1 is cleaned by the corresponding pure water (process S102).

Then, the upper wafer W1 is transferred into the substrate temperature controlling apparatus 42 of the second processing block G2 by the transfer device 61, and the temperature of the upper wafer W1 is adjusted by the substrate temperature controlling apparatus 42 (process S103).

Thereafter, the upper wafer W1 is transferred into the bonding apparatus 41 of the second processing block G2 by the transfer device 61. The upper wafer W1 carried into the bonding apparatus 41 is then transferred into the position adjusting mechanism 120 through the transition 110 by the wafer transfer mechanism 111. Then, the direction of the upper wafer W1 in the horizontal direction is adjusted by the position adjusting mechanism 120 (process S104).

Afterwards, the upper wafer W1 is delivered onto the holding arm 131 of the inverting mechanism 130 from the position adjusting mechanism 120. Then, in the transfer region T1, by inverting the holding arm 131, the front surface and the rear surface of the upper wafer W1 are inverted (process S105). That is, the bonding surface W1j of the upper wafer W1 is turned to face down.

Thereafter, the holding arm 131 of the inverting mechanism 130 is moved to be located under the upper chuck 140 by being rotated. The upper wafer W1 is then transferred to the upper chuck 140 from the inverting mechanism 130. Specifically, the non-bonding surface W1n of the upper wafer W1 is attracted to and held by the upper chuck 140 in the state that the notch of the upper wafer W1 is oriented to a predetermined direction (process S106).

While the above-described processes S101 to S106 are being performed on the upper wafer W1, a processing of the lower wafer W2 is performed. First, the lower wafer W2 is taken out of the cassette C2 by the transfer device 22 and transferred into the transition device 50 of the processing station 3 by the transfer device 22.

Thereafter, the lower wafer W2 is transferred into the surface modifying apparatus 30 by the transfer device 61, and the bonding surface W2j of the lower wafer W2 is modified (process S107). Further, the modification of the bonding surface W2j of the lower wafer W2 in the process S107 is the same as the above-stated process S101.

Subsequently, the lower wafer W2 is transferred into the surface hydrophilizing apparatus 40 by the transfer device 61, so that the bonding surface W2j of the lower wafer W2 is hydrophilized and cleaned (process S108). The hydrophilizing and the cleaning of the bonding surface W2j of the lower wafer W2 in the process S108 are the same as those in the above-described process S102.

Then, the lower wafer W2 is transferred into the bonding apparatus 41 by the transfer device 61. The lower wafer W2 carried into the bonding apparatus 41 is transferred into the position adjusting mechanism 120 through the transition 110 by the wafer transfer mechanism 111. Then, the direction of the lower wafer W2 in the horizontal direction is adjusted by the position adjusting mechanism 120 (process S109).

Afterwards, the lower wafer W2 is transferred onto the lower chuck 141 by the wafer transfer mechanism 111 and attracted to and held by the lower chuck 141 (process S110). Here, the non-bonding surface W2n of the lower wafer W2 is attracted to and held by the lower chuck 141 in the state that the notch of the lower wafer W2 is oriented to a predetermined direction.

Subsequently, a processing of correcting a local deformation of the lower wafer W2 while controlling the temperature of the lower wafer W2 is performed in the bonding apparatus 41 (process S111).

Here, the details of the temperature control and deformation correction processing shown in the process S111 will be discussed with reference to FIG. 9 and FIG. 10A to FIG. 10D. Further, the processing of the process S111 is performed in the state that lower wafer W2 is placed at the non-facing position, that is, in the state that the lower wafer W2 faces the temperature control unit 500. Furthermore, before the processing of the process S111 is begun, the cooling water is flowing in the cooling unit 550 of the temperature control unit 500. This state where the cooling water is flowing in the cooling unit 550 is maintained at least until the processing of the process S111 is finished.

As shown in FIG. 9, if the processing of the process S111 is begun, the heating unit 560 of the temperature control unit 500 is first turned on (process S201). To elaborate, a power is supplied to at least a part of the heating regions 561a provided in the heating unit 560, and the power-supplied heating regions 561a generate heat.

As stated above, by starting the power supply to the heating unit 560 after attracting and holding the lower wafer W2 (after the process S110 of FIG. 8), the heating regions 561a to which no power is supplied can be suppressed from being heated by the heat from the heating regions 561a to which the power is supplied. Accordingly, a region of the lower wafer W2 other than the region required to be heated (that is, the region having a deformation required to be corrected) can be suppressed from being heated.

Subsequently, a first approaching processing is performed (process S202). In the first approaching processing, the main unit 510 is moved down by a preset distance through the elevating unit 530, so that the main unit 510 is brought close to the lower wafer W2 attracted and held by the lower chuck 141 (see FIG. 10A). Through the first approaching processing, the main unit 510 of the temperature control unit 500 is lowered to a height position substantially on a level with the main body 170 of the upper chuck 140, for example.

When the process S201 and the process S202 are performed, the temperature of the lower wafer W2 is not increased since the lower wafer W2 and the heating unit 560 are distanced apart from each other.

Then, a measurement processing is performed (process S203). In the measurement processing, the distance from the reference position to the measurement position, that is, the top surface of the measurement member 545 is measured by using the measurement unit 540 (see FIG. 10A).

Thereafter, a second approaching processing is performed (process S204). In the second approaching processing, by moving up the lower chuck 141 through the first lower chucking moving unit 160 based on the measurement result of the process S203, the lower wafer W2 is brought close to the main unit 510 of the temperature control unit 500 up to a position where the lower wafer W2 is heated by the heating unit 560.

Here, the present inventors have conducted an experiment where the heating unit 560 is located at a position 5 mm away from the lower wafer W2 and the lower wafer W2 is heated at a set temperature of 40° C. As a result of the experiment, the temperature of the lower wafer W2 is found to be hardly changed. Further, the present inventors have also conducted an experiment where the heating unit 560 is located at a position 1 mm away from the lower wafer W2 and the lower wafer W2 is heated at a set temperature of 40° C. As a result of this experiment, the lower wafer W2 can be raised to 28° C. from 23° C.

As can be seen from the above experimental results, to heat the lower wafer W2, the lower wafer W2 needs to be brought very close to the heating unit 560.

Figure 10A:
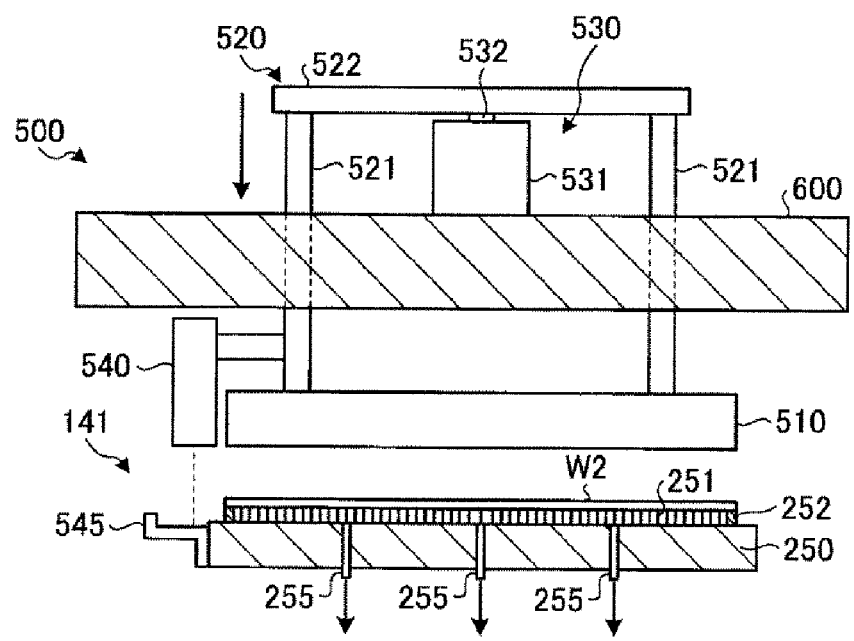
FIG. 10A is a diagram for describing an operation of the temperature control and deformation correction processing.
Figure 10B:
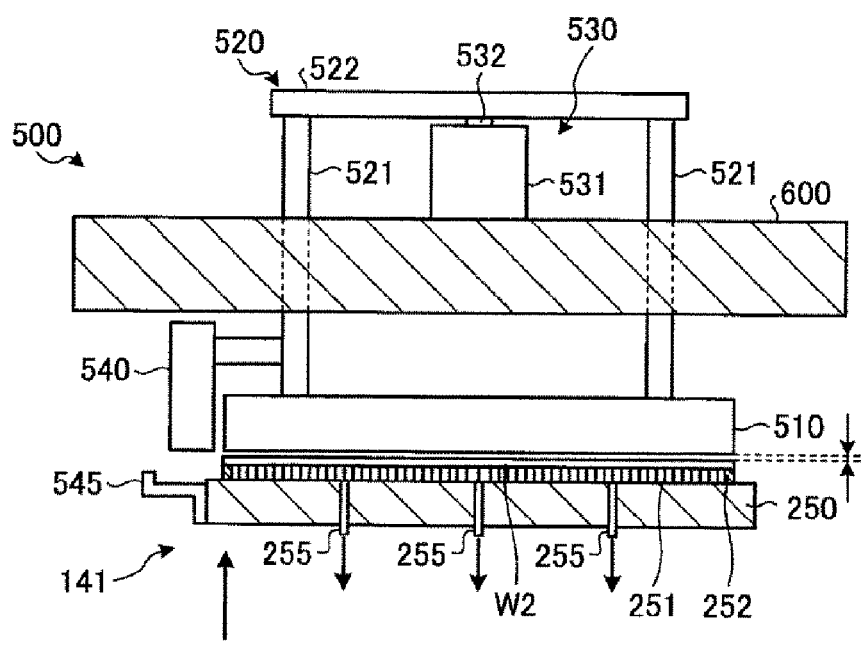
FIG. 10B is a diagram for describing an operation of the temperature control and deformation correction processing.

Thus, in the second approaching processing, the lower wafer W2 is brought adjacent to the heating unit 560 (see FIG. 6A) such that a distance D between the lower wafer W2 and the heating unit 560 of the temperature control unit 500 is less than 5 mm, as shown in FIG. 10B. Accordingly, the lower wafer W2 is heated by the heating unit 560. Further, it may be desirable to set the distance D between the lower wafer W2 and the heating unit 560 of the temperature control unit 500 to be equal to or less than 1 mm, more desirably, equal to or less than 500 μm. By setting the distance D to be equal to or less than 500 μm, a processing time of a heating processing to be described later can be shortened, and, thus, a tact time of a series of operations of the bonding processing can be reduced.

The first lower chuck moving unit 160 is used to adjust the positions of the upper wafer W1 and the lower wafer W2 in the vertical direction in the bonding processing to be described later and is capable of performing relatively high-accuracy positioning. By adjusting the distance D with this first lower chuck moving unit 160, a high-accuracy elevation unit for the temperature control unit 500 is not required. Thus, a cost of the temperature control unit 500 can be cut.

Further, the second approaching processing is performed in the state that the lower wafer W2 is attracted to and held by the lower chuck 141, that is, in the state that the bending thereof is corrected. Accordingly, in the second approaching processing, the lower wafer W2 can be suppressed from coming into contact with the heating unit 560 when the lower wafer W2 is brought close to the heating unit 560.

Subsequently, the heating processing is performed (process S205). In the heating processing, by maintaining for a preset time period the state in which the lower wafer W2 and the heating unit 560 are placed adjacent to each other, the lower wafer W2 is locally heated. At this time, among the regions of the surface of the lower wafer W2, the temperatures of the regions other than the regions heated by the heating regions 561a are adjusted by the cooling unit 550.

As described above, according to the bonding apparatus 41 of the present exemplary embodiment, the local heating of the lower wafer W2 by the heating unit 560 and the temperature adjustment of the lower wafer W2 by the cooling unit 550 can be performed at the same time. If the heating processing is finished, the power supply to the heating unit 560 is stopped.

Subsequently, a separation processing is performed (process S206). In the separation processing, the main unit 510 of the temperature control unit 500 is separated from the lower wafer W2 by moving up the main unit 510 through the elevating unit 530. Further, in the separation processing, the lower wafer W2 may be separated from the main unit 510 of the temperature control unit 500 by moving down the lower chuck 141 through the first lower chuck moving unit 160.

Then, an attraction release processing is performed (process S207). In the attraction release processing, the attracting and holding of the lower wafer W2 by the lower chuck 141 is released.

Accordingly, the lower wafer W2 is separated from the lower chuck 141 and the regions of the lower wafer W2 heated in the heating processing are expanded, so that the local deformation of the lower wafer W2 is corrected (see FIG. 10C).

Thereafter, a re-attraction processing is performed (process S208). In the re-attraction processing, the lower wafer W2 is attracted and held again by the lower chuck 141 (see FIG. 10D). Accordingly, the state in which the local deformation of the lower wafer W2 is corrected can be maintained.

It is desirable that the re-attraction processing is performed before a temperature distribution of the lower wafer W2 is uniformed. For this reason, a time taken until the lower wafer W2 is re-attracted and held in the re-attraction processing after the attracting and holding of the lower wafer W2 is released in the attraction release processing may be set to be, by way of example, equal to or less than 1 second.

Subsequently, the horizontal positions of the upper wafer W1 held by the upper chuck 140 and the lower wafer W2 held by the lower chuck 141 are adjusted (process S112 of FIG. 8).

Figure 11A:
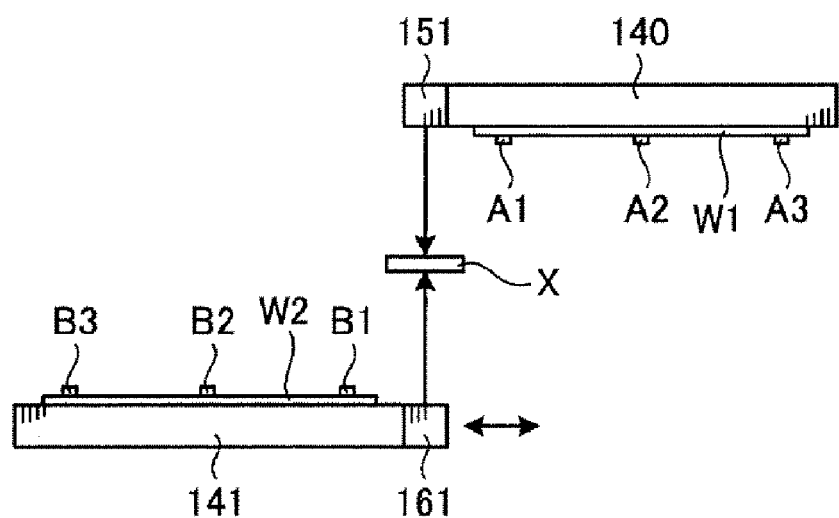
FIG. 11A is a diagram for describing an operation of a bonding processing.

As shown in FIG. 11A, a multiple number of, e.g., three preset reference points A1 to A3 are set on the bonding surface W1j of the upper wafer W1. Likewise, a multiple number of, e.g., three preset reference points B1 to B3 are set on the bonding surface W2j of the lower wafer W2. By way of example, preset patterns formed on the upper wafer W1 and the lower wafer W2 are respectively used as these reference points A1 to A3 and B1 to B3. The number of the reference points can be set as required.

First, as illustrated in FIG. 11A, horizontal positions of the upper imaging unit 151 and the lower imaging unit 161 are adjusted. To elaborate, the lower chuck 141 is moved in the horizontal direction by the first lower chuck moving unit 160 and the second lower chuck moving unit 163 such that the lower imaging unit 161 is located roughly under the upper imaging unit 151. Then, a common target X is checked in the upper imaging unit 151 and the lower imaging unit 161, and the horizontal position of the lower imaging unit 161 is precisely adjusted such that the horizontal positions of the upper imaging unit 151 and the lower imaging unit 161 are coincident.

Figure 11B:
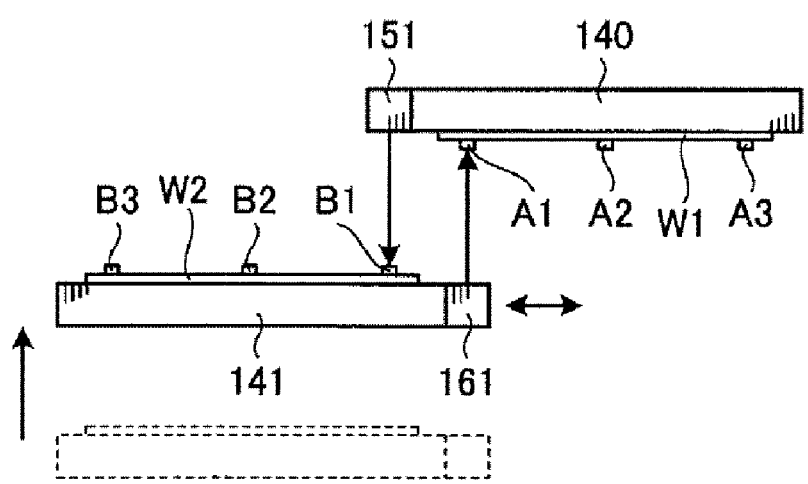
FIG. 11B is a diagram for describing an operation of the bonding processing.

Thereafter, as depicted in FIG. 11B, after the lower chuck 141 is moved vertically upwards by the first lower chuck moving unit 160, the horizontal positions of the upper chuck 140 and the lower chuck 141 are adjusted.

To be specific, while moving the lower chuck 141 in the horizontal direction by the first lower chuck moving unit 160 and the second lower chuck moving unit 163, the reference points B1 to B3 of the bonding surface W2j of the lower wafer W2 are imaged in sequence by using the upper imaging unit 151. At the same time, while moving the lower chuck 141 in the horizontal direction, the reference points A1 to A3 of the bonding surface W1j of the upper wafer W1 are also imaged in sequence by using the lower imaging unit 161. FIG. 11B illustrates a state where the reference point B1 of the lower wafer W2 is imaged by the upper imaging unit 151 and the reference point A1 of the upper wafer W1 is imaged by the lower imaging unit 161.

The obtained image data are output to the control device 70. The control device 70 controls the first lower chuck moving unit 160 and the second lower chuck moving unit 163 to adjust the horizontal position of the lower chuck 141 such that the reference points A1 to A3 of the upper wafer W1 and the reference points B1 to B3 of the lower wafer W2 are respectively coincident based on the image data obtained by the upper imaging unit 151 and the image data obtained by the lower imaging unit 161. Accordingly, as the horizontal positions of the upper chuck 140 and the lower chuck 141 are adjusted, the horizontal positions of the upper wafer W1 and the lower wafer W2 are also adjusted.

Figure 11C:
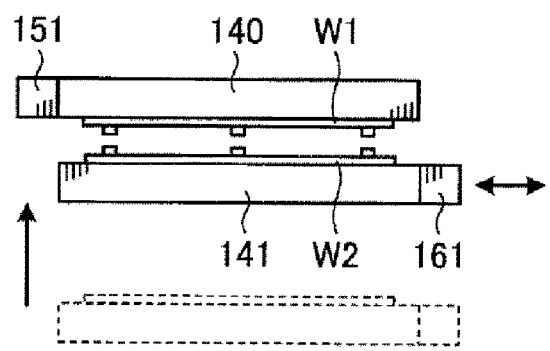
FIG. 11C is a diagram for describing an operation of the bonding processing.
Figure 11D:
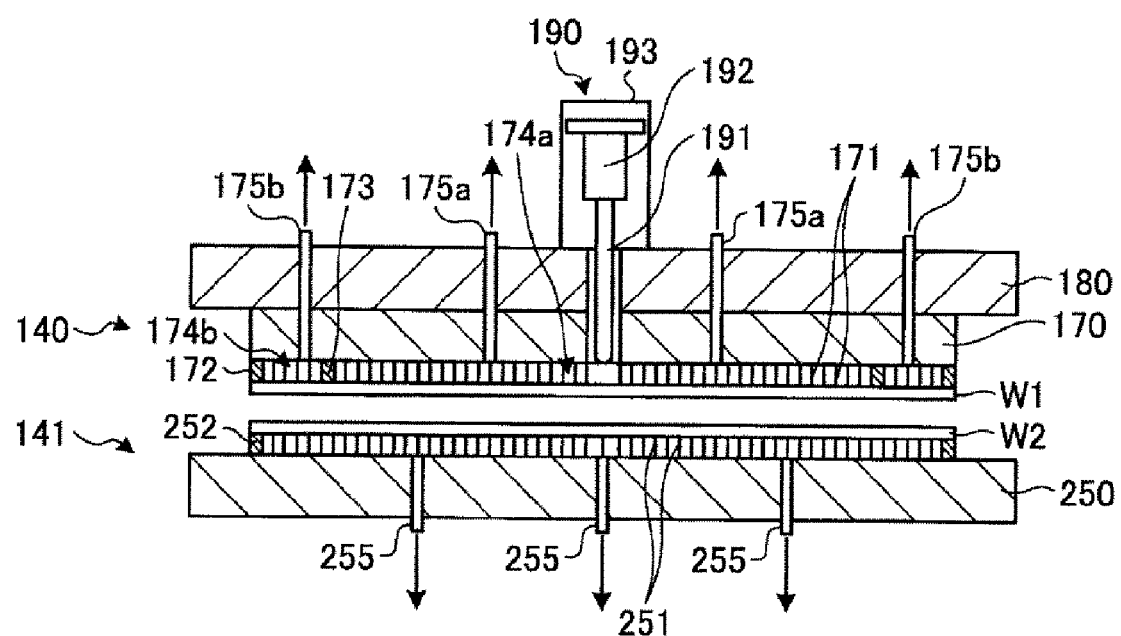
FIG. 11D is a diagram for describing an operation of the bonding processing.

Subsequently, as shown in FIG. 11C, by moving the lower chuck 141 vertically upwards by the first lower chuck moving unit 160, vertical positions of the upper chuck 140 and the lower chuck 141 are adjusted, so that the vertical positions of the upper wafer W1 held by the upper chuck 140 and the lower wafer W2 held by the lower chuck 141 are adjusted (process S113). At this time, a distance between the bonding surface W2j of the lower wafer W2 and the bonding surface W1j of the upper wafer W1 is set to a preset value, e.g., 80 μm to 200 μm (see FIG. 11D).

Then, the bonding processing is performed so that the upper wafer W1 held by the upper chuck 140 and the lower wafer W2 held by the lower chuck 141 are bonded (process S114).

Figure 11E:
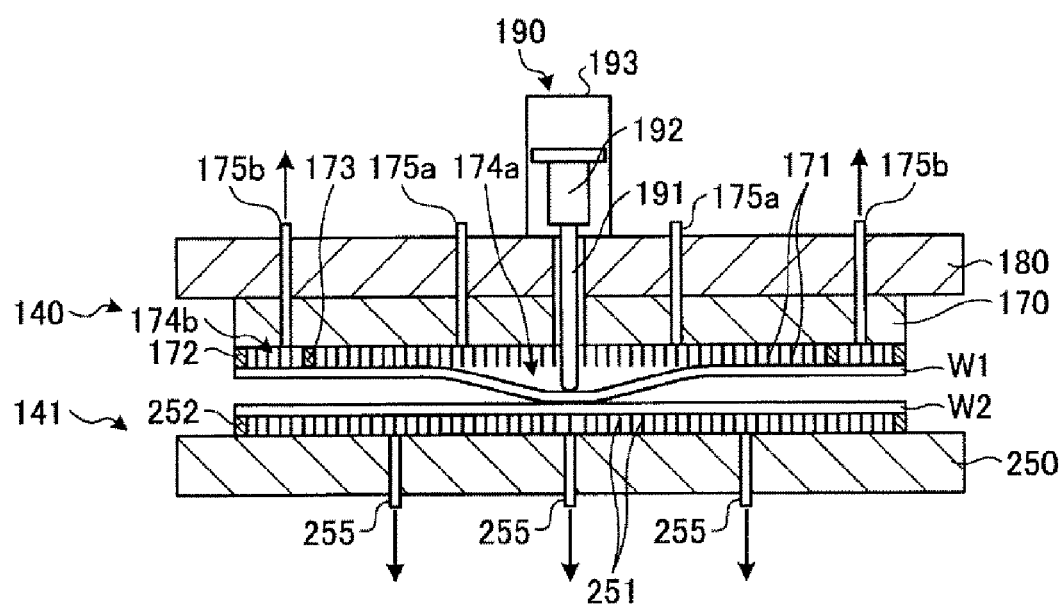
FIG. 11E is a diagram for describing an operation of the bonding processing.

First, as illustrated in FIG. 11E, by stopping the operation of the vacuum pump 177a (see FIG. 7), the attracting and holding of the upper wafer W1 in the first attraction region 174a is released. Then, by lowering the push pin 191 of the striker 190, the central portion of the upper wafer W1 is pushed down, and the central portion of the upper wafer W1 and the central portion of the lower wafer W2 are pressed in contact with each other.

Accordingly, the bonding is started between the central portion of the upper wafer W1 and the central portion of the lower wafer W2 which are pressed against each other. That is, since the bonding surface W1j of the upper wafer W1 and the bonding surface W2j of the lower wafer W2 have been modified in the processes S101 and S107, respectively, Van der Waals force (intermolecular force) is generated between the bonding surfaces W1j and W2j, so that the bonding surfaces W1j and W2j are bonded. Further, since the bonding surface W1j of the upper wafer W1 and the bonding surface W2j of the lower wafer W2 have been hydrophilized in the processes S102 and S108, respectively, hydrophilic groups between the bonding surfaces W1j and W2j are hydrogen-bonded, so that the bonding surfaces W1j and W2j are firmly bonded.

Figure 11F:
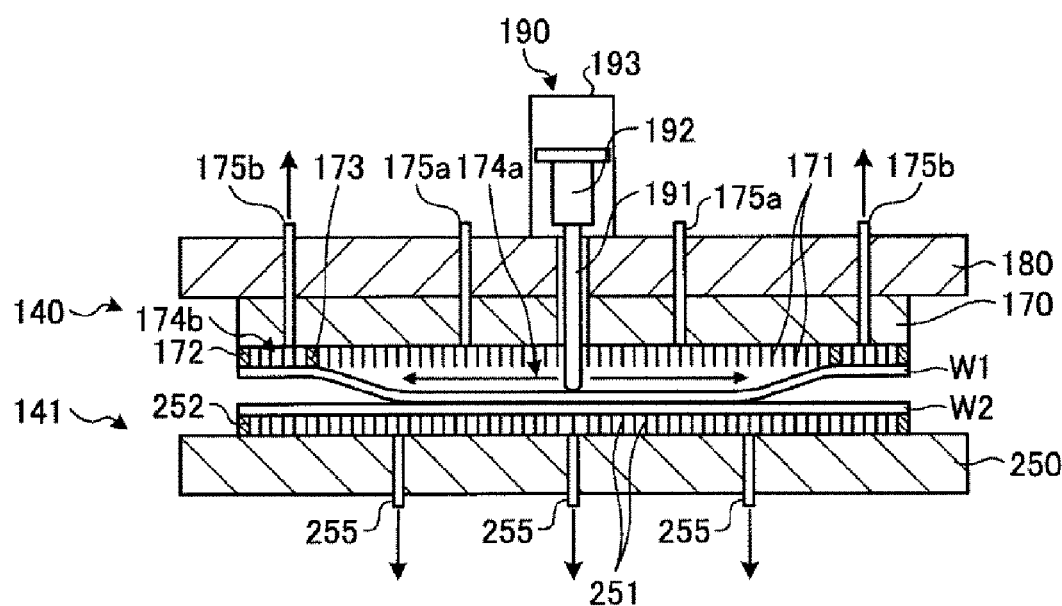
FIG. 11F is a diagram for describing an operation of the bonding processing.

Thereafter, as shown in FIG. 11F, the bonding region between the upper wafer W1 and the lower wafer W2 is expanded from the central portions of the upper wafer W1 and the lower wafer W2 toward the peripheral portions thereof.

Figure 11G:
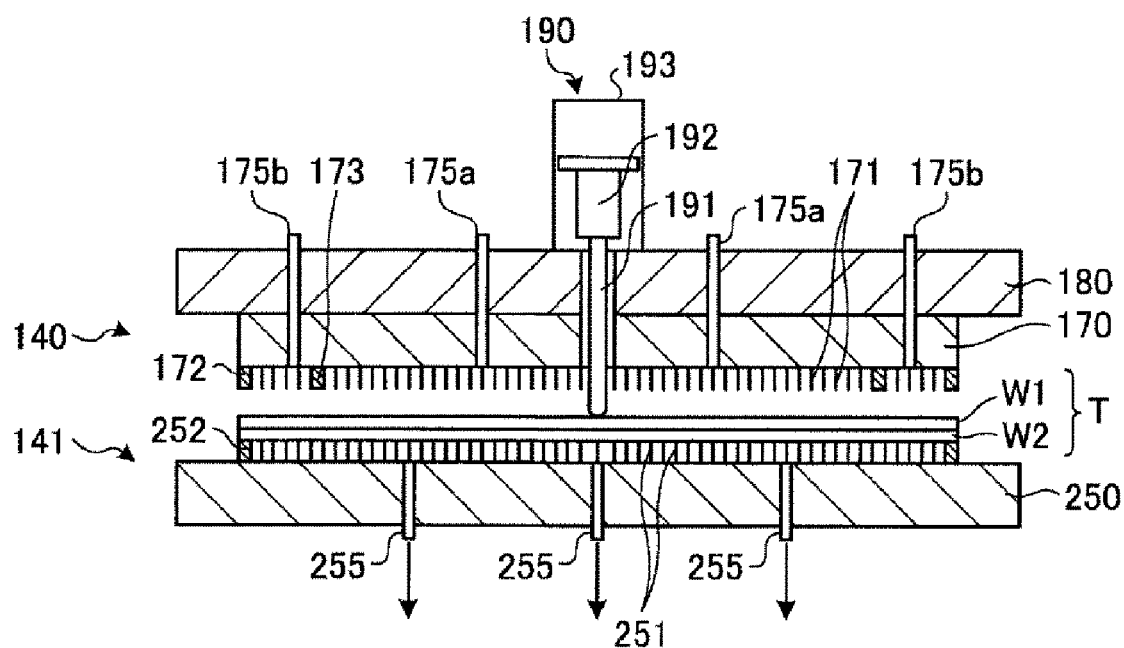
FIG. 11G is a diagram for describing an operation of the bonding processing.

Afterwards, as shown in FIG. 11G, by stopping the operation of the vacuum pump 177b (see FIG. 7), the attracting and holding of the upper wafer W1 in the second suction region 174b is released, so that the peripheral portion of the upper wafer W1 falls on the lower wafer W2. Accordingly, the entire bonding surface W1j of the upper wafer W1 and the entire bonding surface W2j of the lower wafer W2 are brought into contact with each other, so that the upper wafer W1 and the lower wafer W2 are bonded.

Thereafter, the combined wafer T is transferred to the transition device 51 by the transfer device 61, and then is transferred into the cassette C3 by the transfer device 22 of the carry-in/out station 2. Through these processes, the series of operations of the bonding processing are completed.

As stated above, the bonding apparatus 41 according to the present exemplary embodiment includes the upper chuck 140 (an example of a first holding unit), the lower chuck 141 (an example of a second holding unit), the striker 190, the first lower chuck moving unit 160 (an example of a moving unit), and the temperature control unit 500. The upper chuck 140 attracts and holds the upper wafer W1 (an example of the first substrate) from above. The lower chuck 141 attracts and holds the lower wafer W2 (an example of the second substrate) from below. The striker 190 presses the central portion of the upper wafer W1 from above and brings the central portion of the upper wafer W1 into contact with the lower wafer W2. The first lower chuck moving unit 160 moves the lower chuck 141 between the non-facing position where the lower chuck 141 dose not face the upper chuck 140 and the facing position where the lower chuck 141 faces the upper chuck 140. The temperature control unit 500 is disposed to face the lower chuck 141 placed at the non-facing position and locally adjusts the temperature of the lower wafer W2 attracted to and held by the lower chuck 141.

Thus, according to the bonding apparatus 41 of the present exemplary embodiment, the local deformation of the lower wafer W2 can be corrected before the bonding, so that the local deformation that might be caused to the combined wafer T after the bonding can be reduced.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A bonding apparatus, comprising:
a first holding unit configured to attract and hold a first substrate from above;
a second holding unit configured to attract and hold a second substrate from below;
a striker configured to bring the first substrate into contact with the second substrate by pressing a central portion of the first substrate from above;
a moving unit configured to move the second holding unit between a non-facing position where the second holding unit does not face the first holding unit and a facing position where the second holding unit faces the first holding unit; and
a temperature control unit disposed above the second holding unit to face the second holding unit placed at the non-facing position and configured to locally adjust a temperature of the second substrate attracted to and held by the second holding unit,
wherein the first holding unit and the temperature control unit are fixed to a common frame and apart from each other in a horizontal direction, and do not overlap with each other when viewed from above, and
the temperature control unit is configured to locally adjust the temperature of the second substrate at a position overlapping with the second holding unit and not overlapping with the first holding unit when viewed from above.

2. The bonding apparatus of claim 1,
wherein the temperature control unit comprises:
a cooling unit configured to cool the second substrate entirely; and
a heating unit configured to heat the second substrate locally,
wherein the heating unit is positioned to be closer to the second substrate than the cooling unit is close to the second substrate.

3. The bonding apparatus of claim 2,
wherein the temperature control unit further comprises a main unit in which the cooling unit is embedded, and
the heating unit is implemented by a surface-shaped heating element and mounted to a facing surface of the main unit facing the second substrate.

4. The bonding apparatus of claim 3, further comprising:
a controller configured to control the moving unit and the temperature control unit,
wherein the temperature control unit further comprises:
a first elevating unit configured to move the main unit up and down; and
a measurement unit configured to be move up and down along with the main unit by the first elevating unit, and configured to measure a distance from a reference position to a measurement position set on the second holding unit,
wherein the moving unit comprises a second elevating unit configured to move the second holding unit up and down, and
the controller controls the temperature control unit to perform a first approaching processing in which the main unit is brought adjacent to the second substrate by moving down the main unit through the first elevating unit, and controls the moving unit to perform a second approaching processing in which the second substrate is brought adjacent to the main unit by moving up the second holding unit through the second elevating unit based on a measurement result obtained by the measurement unit after the first approaching processing.

5. The bonding apparatus of claim 4,
wherein, in the second approaching processing, the controller allows the second substrate to be brought adjacent to the main unit such that a distance between the second substrate and the heating unit is less than 5 mm.

6. The bonding apparatus of claim 4,
wherein the controller controls the temperature control unit and the second holding unit to perform a heating processing in which the second substrate is heated by the heating unit in a state that the second substrate is attracted to and held by the second holding unit; an attraction release processing in which the attracting and holding of the second substrate by the second holding unit is released after the heating processing; and a re-attraction processing in which the second substrate is re-attracted to and held by the second holing unit after the attraction release processing and before the first substrate and the second substrate are bonded.

7. The bonding apparatus of claim 6,
wherein, in the heating processing, the controller starts a power supply to the heating unit in the state that the second substrate is attracted to and held by the second holding unit.

8. The bonding apparatus of claim 1,
wherein the temperature control unit comprises a heating unit having a plurality of independent heating regions, and controls the plurality of independent heating regions to generate heat selectively.

9. A bonding method of bonding substrates with each other, comprising:
   a first holding process of attracting and holding a first substrate from above by using a first holding unit configured to attract and hold the first substrate from above;
   a second holding process of attracting and holding a second substrate from below by using a second holding unit which is provided at a non-facing position where the second holding unit does not face the first holding unit and configured to attract and hold the second substrate from below;
   a temperature controlling process of controlling a temperature of the second substrate locally by using a temperature control unit which is disposed above the second holding unit to face the second holding unit placed at the non-facing position and configured to locally adjust the temperature of the second substrate attracted to and held by the second holding unit;
   a moving process of moving, after the temperature controlling process, the second holding unit to a facing position where the second holding unit faces the first holding unit by using a moving unit configured to move the second holding unit between the non-facing position and the facing position; and
   a contacting process of pressing, after the moving process, a central portion of the first substrate from above and bringing the first substrate into contact with the second substrate by using a striker configured to bring the first substrate into contact with the second substrate by pressing the central portion of the first substrate from above,
wherein the first holding unit and the temperature control unit are fixed to a common frame and apart from each other in a horizontal direction, and do not overlap with each other when viewed from above, and
in the temperature controlling process, the temperature control unit is disposed at a position overlapping with the second holding unit and not overlapping with the first holding unit when viewed from above.

10. The bonding method of claim 9,
wherein the temperature control unit comprises a heating unit having a plurality of independent heating regions, and
in the temperature controlling process, the plurality of independent heating regions are controlled to generate heat selectively.

* * * * *